United States Patent [19]

Bauman

[11] 4,360,776
[45] Nov. 23, 1982

[54] ESR BASED PORTABLE MICROANALYTIC APPARATUS AND METHOD

[76] Inventor: Albert J. Bauman, 524 Oakdale Dr., Sierra Madre, Calif. 91024

[21] Appl. No.: 186,116

[22] Filed: Sep. 11, 1980

[51] Int. Cl.³ ............................................. G01N 27/00
[52] U.S. Cl. .................................................. 324/316
[58] Field of Search .......... 324/300, 316, 317, 58.5 C; 356/38, 36

[56] References Cited

U.S. PATENT DOCUMENTS 3,526,480  9/1970  Findl ...................................... 356/38
3,843,257 10/1974  Wooten .................................. 356/36
4,314,204  2/1982  Biehl ..................................... 324/316

Primary Examiner—Michael J. Tokar
Attorney, Agent, or Firm—Wagner & Bachand

[57] ABSTRACT

A modified electron spin resonance (ESR) apparatus and a novel sample preparation and handling means therefor is provided for diverse analytic and monitoring purposes requiring both high sensitivity and high specificity, and in portable form for field use.

41 Claims, 8 Drawing Figures

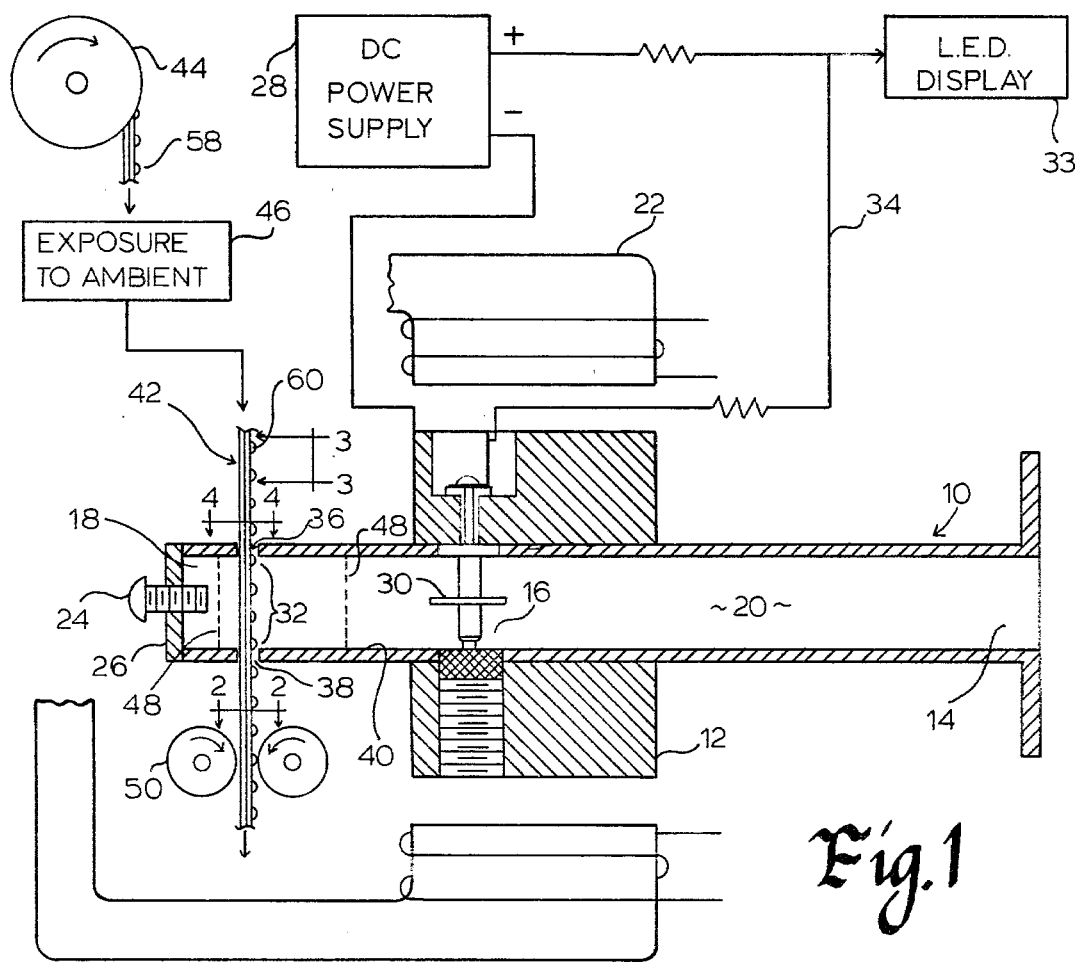
Fig.1
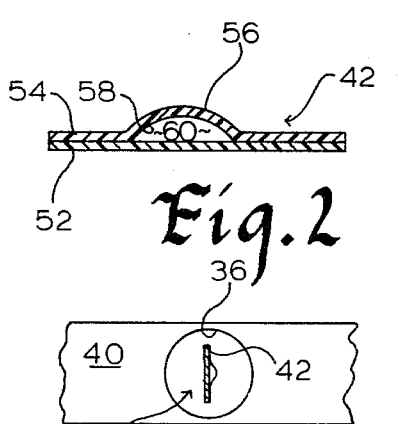
Fig.2
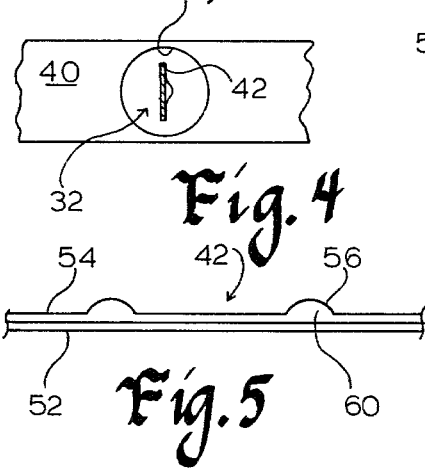
Fig.4
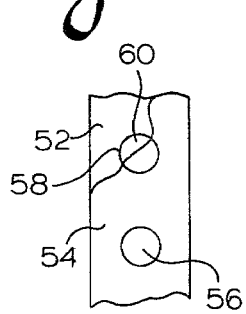
Fig.3
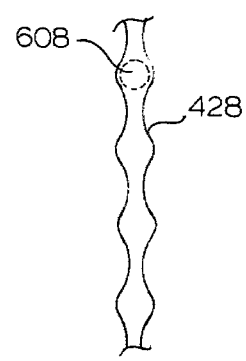
Fig.5
Fig.8
Fig.7
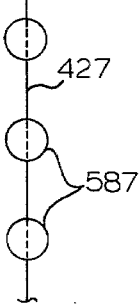
Fig.6

ESR BASED PORTABLE MICROANALYTIC APPARATUS AND METHOD

This application is based in part on Disclosure Documents Nos. 078662 and 079990.

TECHNICAL FIELD

This invention has to do with microanalytic apparatus and methods, and more particularly, with novel apparatus and methods for the highly sensitive and highly specific detection, monitoring and measuring of trace quantities of target entities of interest in a fluid, gas or liquid, ambient, such as the atmosphere or water streams.

Importantly, the present invention brings together for the first time to the inventor's knowledge the remarkably precise, specific, and versatile electron spin resonance (ESR) technology now available for sophisticated, e.g. microbiological analysis at large commercial and academic laboratories, and the ease of sample preparation and portability of grossly macroanalytic field test units now known for on-site inspection, detection, monitoring and measurement of e.g. toxic gases. The present invention thus takes what has been a very valuable but unwieldy laboratory apparatus, and by simplification thereof and development of sample means adapted for the purpose, provides a field detection and monitoring device giving real time information on conditions as diverse as excessive pesticide concentrations in a farm field, unduly high $SO_2$ concentrations in effluent gases or the atmosphere, and the presence of transition metal ions indicative of useful quantities of valuable mineral bearing ore along the course of mountain streams.

BACKGROUND ART

In the ensuing description, familiarity with ESR spectrographic microanalysis and the availability and utilization of spin labels in such analysis will be assumed. Further background is provided in *Spin Labeling, Theory and Applications* Vols. I and II, 1976, 1979, edited by Lawrence J. Berliner, published by Academic Press, New York. This invention makes use of spin labeling techniques to prepare target entity specific sample means, which upon contact with the target entity will characteristically generate free radicals of the spin resonating type, e.g. by displacement, as a function of the target entity presence. These specific sample means are packaged in a particular novel manner according to the invention enabling controlled exposure to the ambient fluid of interest while minimizing spurious spin resonant response, by the selective exclusion of nontarget ambient medium constituents, for example; and thereafter the invention effects measurement of the exposed sample target entity presence by subjecting the sample in its original exposed state to appropriate milliwatt levels of microwave energy at an appropriate frequency, e.g. 9.20 GHz. and sensing and recording the tumbling of the spin resonating free radicals.

There has been much written on the microanalytic uses of spin resonance phenomena, by the selective spin labeling of one or another reagent, for selective, detectable reaction, and such knowledge is a prerequisite to the invention disclosed here, wherein such knowledge is made immensely more useful than mere laboratory usage, by disclosure of the means to take the accumulated information out of the laboratory and into the field where needed measurements can be made and acted upon immediately to protect workers and the environment, and to assist industry in finding new sources of scarce materials at minimum cost and effort.

Integral to the present invention is the use of a microwave generator. Various of these have been proposed and built. Presently preferred for use in carrying out the present invention is a modification of the so-called IMPATT diode device, the basic form of which is described in articles by Hogg, *Applications of IMPATT Diodes as rf Sources for Microwave EPR Spectroscopy* Rev. Sci. Vol. 44, No. 5, pp. 582–587, May 1973; and *A Low Cost X-Band IMPATT Diode Marginal Oscillator for EPR* Amer. J. Phys. Vol. 41, pp. 224–229, February, 1973. An important feature of the invention is the modification of the Hogg type device to enable field use and the provision of the sample means adapted to perform with the thus modified device, to realize the objects of the invention.

DESCRIPTION OF THE INVENTION

It is accordingly a major object of the present invention to provide apparatus for the highly sensitive, highly specific detection and monitoring, in the field, of minute or trace quantities of target entities present in an ambient, gas or liquid fluid. Another object is the provision of method to reliably, inexpensively and quickly, and on a real time basis, monitor, detect and measure the presence or absence of a target entity of interest in an ambient fluid. Other objects include the provision of novel sample means useful in using the present apparatus and in carrying out the invention method, including sample means structures exposing spin labeled free radical precursors to contact with the target entity while blocking selectively unwanted or spurious signal generating constituents of the ambient sampled. Still other objects include modification of known diode devices for simplification in use and feasibility in processing the novel sample means provided by the invention.

These and other objects of the invention to become apparent hereinafter are realized in accordance with the invention in an ESR spectrometer apparatus having an elongated microwave cavity providing a locus for receiving a sample to be measured for spin resonance response, a microwave energy source for the cavity, and a detector responsive to the microwave energy generated spin resonance signal of the sample in the cavity in sample identifying relation, through the provision of the improvement comprising, means defining a cavity passage within the locus, the passage extending between an inlet and an outlet in the wall of the cavity and adapted to transport of the sample through the cavity passage in microwave energy exposed relation and freely of contact with the walls of the cavity beyond the passage. Preferably, the cavity passage inlet and outlet are opposed and lie on a common axis, the common axis being transverse to the cavity longitudinal axis; the cavity passage is adjacent one end of the cavity, and the cavity is open-ended at its other end.

The invention further contemplates in an ESR spectrometer apparatus having an elongated microwave cavity providing a locus for receiving a sample to be measured for spin resonance response, a microwave energy source for the cavity, and a detector responsive to the microwave energy generated spin resonance signal of the sample in the cavity in sample identifying relation, the mentioned improvement comprising, means defining a cavity passage within the locus, the passage extending between an inlet and an outlet in the wall of the cavity, and, further, means to transport the sample through the cavity passage in microwave energy exposed relation and freely of contact with the walls of the cavity beyond the passage. Typically, the sample transporting means comprises a nonspin resonance signal generating inert carrier dimensioned to traverse the cavity passage in sample transporting relation. The apparatus further includes means supporting the carrier within the cavity.

In preferred embodiments, the apparatus carrier comprises a tape elongated relative to the length of the cavity passage, and means beyond the cavity to supply and take up the tape in cavity passage traversing relation, e.g. the sample transporting carrier comprises an elongated tape of indefinite length defining a longitudinally distributed succession of sample locations, the tape being adapted to move progressively through the cavity passage for longitudinally successive presentation of sample locations for spin resonance response measurement of sample at the locations and coincident with movement of the tape through the passage cavity.

Discrete sample means are preferably provided on the tape at the sample locations thereon, such sample means typically comprising a spin resonant free radical precursor having spin resonant free radical generating response selectively to exposure to ambient fluid containing a predetermined target entity. In a particular embodiment, the tape comprises a succession of microporous beads defining the sample locations, the sample means being disposed in the bead pores in ambient fluid protected and target entity exposable relation. In such embodiments, the beads generally comprise synthetic organic polymer inert to the ambient fluid and preferentially permeable to the predetermined target entity, e.g. polymer of olefins having 2 to 4 carbon atoms, or ultramicroporous cellulose triacetate "sponge".

In another embodiment, the tape comprises an ambient fluid resistant film, the sample means being supported on the film in target entity exposable relation, and preferably enclosed in the film in ambient fluid protected and target entity exposable relation. In such embodiments, typically, the film comprises synthetic organic polymer inert to the ambient medium and preferentially permeable to the predetermined target entity, e.g. the film may comprise cellulose triacetate or comprise polymer of an olefin having from 2 to 4 carbon atoms.

The carrier preferably includes multiple layers of film defining the tape and assembled to enclose in spaced relation a succession of sample means, continuously; or may comprise such multiple layers protecting and exposing the sample means and carried discontinuously on the tape.

In yet another embodiment, the tape is tubular, the sample means being located within the tubing, continuously or discontinuously e.g. periodically, in ambient fluid protected and target entity exposed relation, the tubing preferably comprising gas permeable silicone rubber.

There is further provided for use in the foregoing or other analytic apparatus a sample transporting carrier adapted for carriage of samples through a microwave cavity passage, the carrier comprising an elongated tape of indefinite length and having sample means thereon comprising a spin resonating free radical precursor at a longitudinally distributed succession of sample locations, the tape being adapted to move progressively through the cavity passage for longitudinally successive presentation of sample locations for spin resonance response measurement of sample at the locations and coincident with movement of the tape through the passage cavity. Other features of the carrier have been indicated above and include: discrete sample means on the tape at the sample locations thereon; the sample means comprising a spin resonant free radical precursor having spin resonant free radical generating response selectively to exposure to ambient fluid containing a predetermined target entity; the tape comprising a succession of micropermeable beads defining the sample locations, the sample means being disposed in the bead pores in ambient fluid protected and target entity exposable relation; the beads comprising synthetic organic polymer inert to the ambient fluid and preferentially permeable to the predetermined target entity; the beads comprising polymer of olefins having 2 to 4 carbon atoms; the tape comprising an ambient fluid resistant film; the sample means being supported on the film in target entity exposable relation; the sample means being enclosed in the film in ambient fluid protected and target entity exposable relation; the film comprising synthetic organic polymer inert to the ambient medium and preferentially permeable to the predetermined target compound; the film comprising cellulose triacetate; the film comprising polymer of an olefin having from 2 to 4 carbon atoms or cellulose triacetate polymer; use of multiple layers of film to define the tape and assembled to enclose in spaced relation a succession of sample means; provision of multiple layers of film ambient fluid protectively and target entity exposably enclosing the sample means in discontinuously supported relation on the tape; the tape being tubular, the sample means being located continuously or discontinuously, e.g. periodically within the tubing in ambient fluid protected and target entity exposed relation; and the tubing comprising gas permeable silicon rubber.

The invention further provides a method of monitoring the presence of trace quantities of a target entity in situ in an ambient fluid, including exposing a selectively target entity-responsive spin resonant free radical precursor to contact with target entity present in the ambient fluid in supported relation, for free radical resonant response to the presence of the target entity in the ambient fluid; and subjecting the supported, exposed precursor to microwave energy sufficient to spin resonate precursor-provided free radicals, and sensing the spin resonance as an indication of the presence or absence of the target entity. The method further contemplates selectively blocking ambient fluid constituents other than the target entity from free radical generating contact with the precursor, e.g. by interposing a selectively permeable synthetic organic film between the ambient medium and the precursor in selective fluid constituent blocking relation; as well as exposing to the ambient fluid in timed succession a series of like supported precursors in ambient fluid target entity condition change monitoring relation, suitably while supporting the precursor on a tape adapted to transverse a microwave cavity passage in spin resonating free radical spin resonance measuring relation in successive sequence with precursor exposure to the ambient fluid.

THE DRAWINGS

The invention will be further described as to several illustrative embodiments in conjunction with the attached drawings in which:

FIG. 1 is a generally schematic view, portions of which are shown in section, of the portable microanalytic ESR spectrometer apparatus according to the invention;

FIG. 2 is a view in transverse section, taken on line 2—2 in FIG. 1, of the carrier tape and sample means according to the invention;

FIG. 3 is plan view, partly broken away, of the carrier tape and sample means, taken on line 3—3 in FIG. 1.

FIG. 4 is fragmentary view on the tape and sample means traversing the cavity passage, taken on line 4—4 in FIG. 1.

FIG. 5 is a side elevation of the carrier tape and sample means of FIG. 1.;

FIG. 6 is a longitudinal sectional view of a multilayer form of tape and sample means;

FIG. 7 is a like view of another form of tape and sample means; and

FIG. 8 is a like view of still another view of tape and sample means.

PREFERRED MODES

With reference now to the drawings in detail, in FIG. 1, an ESR spectrometer adapted from the IMPATT diode based device described by Hogg in *Rev. Sci. Instrum.*, op cit. with the addition of a magnetic sweep capability and detector means, in accordance with the invention, is shown. The apparatus comprises a waveguide 10 supported by a support block 12, open at one end 14, and mounting diode 16 inward of the cavity other end 18. The cavity 20 defined by the waveguide 10 is surrounded by magnetic coil 22 for controlling the magnetic field within the waveguide cavity. Adjustment screw 24 in end wall 26 may be used to vary the Q or resonant frequency of the cavity. Microwave frequency signals are provided by power supply 28 driving element 30 at frequencies in the S ($1 \times 10^9$ Hz) or X ($9.2 \times 10^9$ Hz) Bands, for example, as needed to resonate the particular spin resonant species used in the apparatus for test or monitoring purposes. The S-Band device is used to effectively detect free radicals in aqueous media, e.g. biological fluids, while the X-Band device is used to detect free radicals in organic fluid media. The variation in energy used over time responsive to sweeping the cavity 20 with varying magnetic fields is sensed and converted to readable data at the detector 33 using resistance loop 34 and the resonant peaks or patterns are read as a yes/no or continuous measurement of the presence or absence of the material of interest.

The existence of the spin resonant label is detected initially by displacement of the spin label from its bound or nonfree tumbling condition, and then the vibrational exicitation of the free species which produces a characteristic detectable signature peculiar to that species. Thus if one is able to selectively release a spin resonant species by displacement from the host compound or molecule, he is able to determine the existence or not the reagent which releases the species, and thus to monitor or detect the presence of a reagent of interest in the host compound or molecule, or in the environment in which the host is found.

In previously known massive ESR devices, the sample to be monitored is enclosed in a vial or other suitable vessel and inserted in the cavity 20 which is closed and subjected to energy input. The need to individually insert and remove samples and close up the apparatus between insertions and removals precludes rapid, repeated, and immediate test operations and makes previously known apparatus, even where the great bulk and extreme costliness could be tolerated in theory, unsatisfactory for field use to monitor pesticides, for example, for lack of producing real time data.

In accordance with the present invention, however, the conventional form of ESR apparatus is modified, by the provision of the cavity passage indicated at 32, which traverses the cavity 20 from passage inlet 36 to passage outlet 38, each in the longitudinal wall 40 of the cavity. Further, means to traverse the cavity passage 32 with samples to be measured is provided in the form of carrier tape 42, which, it will be seen, in the embodiment illustrated unrolls from reel 44, past a sampling exposure zone, e.g. ambient air in a field, schematically depicted at 46 for initiating the spin label displacement reaction which will enable detection subsequently, and is guided into the inlet 36 in the cavity wall 40. The tape 42 traverses the cavity passage 32 within the microwave energy exposure locus 48 therein shown in dotted outline. The tape 42 is drawn from the cavity passage 32 by the take-up rolls 50, suitably constructed of soft foam rubber.

The tape 42 is typically approximately $\frac{1}{8}''$ wide and the passage inlet 36 and outlet 38 greater in diameter than this whereby the tape may enter and leave the cavity passage 32 without abrading cavity wall 40 contact. Specific size, as to width or height of the tape 42 is not critical provided the passing through the cavity passage 32 is untrammelled as described herein. Similarly, the materials of construction of the tape 42 are not narrowly critical, provided materials deleterious to proper operation of the microwave cavity, e.g. metals are avoided, and spurious signal generators are not introduced with the tape. In general then suitable tape materials are synthetic organic plastics and cellulosics such as paper and like fibrous materials formed or formable into webs or ropes suitable for carrying sample into and out of the cavity passage 32. The specific configuration of the tape 42 can be as widely varied as the sampling to be done by this versatile instrument, as will be evident from the following. Additionally, the term "tape" herein is used in the sense of a flexible support for one or more sample stations which may be deposited on the tape, or which may be incorporated in the construction of the tape.

Whatever the specific tape 42, there is also introduced into the cavity passage 32, for microwave radiation exposure, a sample borne on the tape, which sample is both reflective of the ambient fluid to be inspected, and spin resonance responsive as a function of the presence or absence of the entity of interest in the ambient fluid. Thus, initially, the sample, like the tape 42, must be impervious to destruction by the ambient fluid, adapted to discriminate between the entity of interest and all other spurious species present, and sufficiently small to pass the cavity passage 32 without encountering the cavity wall 40.

A variety of sample means are disclosed herein as illustrative of the broad spectrum of suitable types. For example, in FIGS. 1–4 the tape 42 comprises a lower layer 52 of polyethylene, and an adherent upper layer 54 of gas permeable dimethyl silicone rubber. Periodically, along the longitudinal extent of the tape 42, sample locations 56 are defined by spacing apart the upper and lower layers 54 and 52, respectively, to provide a pocket 58 in which the sample 60 is to be disposed.

The sample 60 disposed at the sample location is typically a discrete means, but may alternatively be a continuum of spin resonance responsive agent in a suitable displaceable form for use. Any spin resonant material having predictable response to stimuli may be used herein for the detection and/or monitoring of that stimuli, by arranging to expose the spin resonant material to what is to be measured and then subject the exposed material to microwave energy in detectable relation as in the apparatus hereinabove described. A typical discrete sample means on the tape at each sample location will comprise a spin resonant free radical precursor having spin resonant free radical generating response selectively to exposure to ambient fluid containing a predetermined target entity.

With reference to FIG. 7, the tape 427 comprises a succession of microporous beads 587 defining the sample locations, the sample means being embedded in the beads in ambient fluid protected and target entity exposable relation as the tape is passed through zone 46 and sample locus 48 depicted in FIG. 1 in lieu of tape 42 and sample 60 in that Figure. The beads 587 typically comprise synthetic organic polymer inert to the ambient fluid and preferentially porous to the predetermined target entity, such as beads which comprise polymer or olefins having 2 to 4 carbon atoms. Such beads can also comprise ultramicroporous cellulose triacetate sponge wetted with an aqueous solution of enzyme, antibody, or other biological target molecule which has been spin labeled. The "sponge" contents can then exchange rapidly with biological fluids to be assayed which are brought into contact with the bead by dipping the bead momentarily into the biological fluid. The physical nature and properties of these sponges are described in another context by A. S. Obermayer and L. D. Nichols, in *Controlled Release Polymeric Formulations* at pages 303–307, D. R. Paul and F. W. Harris, Editors, American Chemical Society, Washington, D.C. (1976).

With reference now to the embodiment of FIG. 6, there is shown a multilayer carrier 426, which comprises an upper layer 62 of e.g. gas permeable dimethyl silicone rubber or other selectively gas permeable film suitable to seal the underlayer from water loss in use. The middle layer 64 comprises, for example, an ultramicroporous, homogeneous, membrane comprising two interpenetrating and largely independent phases, including a strong thermally stable cellulose triacetate resin phase, and a second phase comprising a liquid such as a buffer solution containing immuno chemical reagents, organic solvent, such as carbon tetrachloride containing spin-labeled chelating ligands. A commercial form of layer 64 material is available from Moleculon Research Corporation, Cambridge, Mass. under the trademark "Poroplastic". The bottom layer 66 comprises a physical support for the layers 62 and 64 above and suitably is composed of an polyolefin, cellulosic or like inert material which can be attached to the upper layers and which if desired has the function of sealing against unwanted incursions into the carrier.

With reference now to FIG. 8, the tape 428 is tubular and formed of the same types of material discussed in connection with flat film embodiments, e.g. polyethylene and the like and particularly one of the silicone rubbers. The sample 608 is located periodically within the tape tubing 428 in ambient fluid protected and target entity exposed relation.

Use of preferentially porous films or beads is preferred for their ability to screen out potentially disruptive molecular species, and to ensure selectivity in what reaches the spin labelled sample means. Details of the displacement reactions typically contemplated by the present invention are found in the Examples following.

EXAMPLE 1

Atmospheric Gas Contaminant Detection

An $SO_2$ detector useful in the monitoring for immediate and cumulative levels of $SO_2$ employs the above-described IMPATT diode oscillator having a sample through passage at its normally closed end, and using as the sample transport the following carrier structure which is exposed to the air and then passed through the sensor apparatus shown in FIG. 1. The carrier structure for $SO_2$ detection is that shown in FIG. 7, a succession of polymer beads connected together on a nonmetallic rope with adequate spacing, about 1–2 cm. for distinctive measurements. The polymer chosen is one known to be selectively sorbtive of $SO_2$, i.e. styrene-dimethylaminopropylmaleimide copolymer (1:1), with the styrene moiety spin-labelled, e.g. with Nitroxide I (2,2,6,6-tetramethylpiperidyl-1-oxy radical) for free radical spin resonance tumbling response to exposure to microwave energy upon and in proportion to the $SO_2$ presence in the sample bead. Based on the sensitivity of the ESR apparatus, e.g. near $10^{13}$ spins or $10^{-10}$ moles, the presence of on the order of $10^{-8}$ grams of spin label Nitroxide I should be detectable, indicating that perturbed styrene polymer moiety sensitivity is well within the alarm device range, enabling real time environmental measurement of $SO_2$ concentrations. NO can be similarly measured on a real time basis. Application of this principal to on-site, real time pesticide concentration, for the protection of farm workers is illustrated in the following Example.

EXAMPLE 2

Trace Organic Vapor Detection

A trace toxic sensor useful in the farm field for detection, monitoring and, if necessary based on comparisons with assumed safe levels, alarm response to detected changes to unsafe toxic chemical levels is provided using the ESR device disclosed coupled to a microprocessor capable of quantitating the data continuously obtained. The sensor in the first embodiment of this apparatus is, like the previous Example, a polymer bead coupled together with other polymer beads in the manner of FIG. 7. Because the toxic traces of interest in the farm field application of the invention are those presently most difficult to detect: the phosphate and phosphonate esters, the so-called cholinesterase antagonists, particularly in the expected presence of dust, smoke, other pesticides, oil droplets and other airborne contaminants, a sensor system is provided which is capable of signaling changes in the very low concentrations of these materials, relative to a predetermined baseline value. This is accomplished with ESR spectrometry by employing enzyme based sensors and utilizing immunoassay techniques. It is known that immunological assay involves binding a specific chemical compound to a specific antibody to form a noncovalent complex. Use of a labeled chemical compound to saturate the sites of the antibody, followed by displacing of the labeled chemical by an unlabeled chemical enables assay of the quantity of the unlabeled chemical. Where the chemical is labeled with a nitroxide free radical, the labeled chemical is a spin free radical precursor which when freed by displacement of the labeled chemical from the covalent complex, and subjected to microwave energy in the invention apparatus, provides detectable levels of tumbling free radicals related in an ascertainable, non-linear way to the presence of the unlabeled chemical species.

A. One type of sensor for this purpose is useful in the "blocked spin assay" technique. The porous cellulose triacetate polymer bead is the preferred form. However, polymethylmethacrylate, and glass discs can likewise be used as sample carriers. The bead is prepared by di-imide coupling an enzyme of the cholinesterase active site family (cholinesterase, acetylcholinesterase, elastase, subtilisin, trypsin, alpha-chymotrypsin, kallicrein, papain, thrombin, or cutinase, among many) to bind the enzyme to the carrier bead. After wetting with a stabilizing liquid, such as Triton X-100 or a liquid saccharide which wets the enzyme surface and acts as a collection medium for the ambient anticholinesterases in the air, the enzyme is reacted with a reversibly bound spin labeled species, described below, having the desired level of specificity through steric blocking.

The carrier is ambient air exposed, e.g. by streaming air upon the carrier thus prepared, followed by passing the carrier, thus exposed through the cavity passage of the invention apparatus for microwave energy subjection, and detection of spin resonance response. Because, phosphorylating moieties, such as phosphate ester pesticides, bind irreversibly to the active sites, the reversibly bound, labeled species, are replaced into the ambient Triton-X or other fluid. "Bound" spin labeled moieties have a distinctive ESR spectral signature at lowfield frequency which changes in an instant to the characteristic hyperfine pattern of the isotropically-tumbling free-radical when the moiety is "unbound" and the free radical released in the presence of the microwave energy of the apparatus.

High degrees of specificity are built into this sensor by the use of relatively more or less bulky decamethoniums, after the manner of Wee et al Mol. Pharmacol. 12, 667–677 (1976) by masking the sites of enzyme with selected decathoniums of varying steric bulk. The bulkier ones completely block the site, while those less bulky only partially block and thus only partially inhibit the enzyme. Decathoniums are reversible inhibitors which must bind to the esteratic site, whereby the esteratic sites can be effectively blocked to pesticide species by size classification through use of selected bulk decathoniums, enabling a size dependent specificity in the analysis, useful for monitoring the relatively smaller molecule phosphate ester and other aliphatic pesticides, while excluding smoke, for example.

Sensitivities of the device are down to the $10^{-7}$ mole range, and within one minute of dosage, as the antagonistic pesticide displaces spin label free radical into the ambient liquid to a level of approximately $10^{12}$ spins.

B. Spin immunoassay is accomplished following the foregoing Part A, but substituting as the protein bound to the bead the specific antibody to the pesticide hapten. The labeled hapten is displaced by free pesticide hapten which dissolves in the Triton X-100 film surrounding the antibody surface layer. Similarly the ultramicroporous cellulose triacetate "sponge" carrier bead mentioned above can be used to carry the reagent liposome system developed for spin membrane immunoassay. In this technique, sensitivity is increased several fold by the immunochemical release of spin labeled "sensitizers" trapped within liposomes which are lysed. L. H. Piette and J. C. Hsia, in *Spin Labeling II Theory and Applications,* L. J. Berliner, Ed. Academic Press, New York (1979).

EXAMPLE 3

Trace Metal Detection

Trace metals in water are selectively extracted into an organic phase by means of chelating ligands; such ligands can also be bound covalently to a polymeric support to form ligand exchange resins. The metals isolated from the water are usually characterized by a conventional technique applied to the organic extract, such as optical absorption at the requisite wavelength (Iwantscheff, G "Das Dithizon und seine Anwendung in der Mikro-und Spurenanalyse", Verlag-Chemie, Weinheim (1958)). Zolotov (Zolotov, Yu. A., Analyst 103, 56–67 (1978)) has demonstrated the use of a spin labeled ligand to extract zinc from water solution into an organic phase and subsequently to from water solution into an organic phase and subsequently to quantitate its level there by means of ESR. He used the compound potassium 2,2,6,6-tetramethylpiperidine-1-oxy-4-xanthate; I use diphenylthiocarbazone, for example, in the same fashion, first modifying the molecule by replacing one of its phenyl rings with a spin labeled system, such as that used by Zolotov with the xanthate. The remaining ring can also be used to covalently bond the "dithizone" to an inert carrier such as carboxymethylcellulose, if desired, e.g see Bauman, A. J., *Anal. Chem.* 39, 932–935 (1967)) who used it to extract ultratrace transition metal cations from natural waters. This, then, comprises an additional general refinement to the method described by Zolotov, as the spin labeled "ligand exchange resin" can now act both to collect and to signal through its ESR behavior the type of metal and the concentration present in the "resin".

EXAMPLE 4

Transition Metal Characterization

It is clear that the ESR signals from spin labeled ligands, such as dithizone or oxine (8-hydroxyquinoline), will provide diagnostic data on the nature and oxidation state of the cations extracted by them into an organic phase or into a ligand exchange resin of which they are the ligands. This is because the metal cation complex exhibits structural variation; Iwantscheff, op. cit. (page 86) notes that the dithizonates of the 23 cations with which it complexes exhibit diagnostically significant differences both in the pH of optimal extraction and in the color (wavelength of maximum absorption). Thus the ESR signals from the bound metals will also vary, and can be detected in real time in field applications.

EXAMPLE 5

Explosives and Entry Port Applications

It is clear that high explosive molecules, such as TNT, can be covalently bonded to common proteins as lysozyme, as by the carbodiimide method and thus used to prepare a hapten to develop antibodies. Thus the method I have developed can be used to specifically detect trace airborne ambient levels of high explosive vapors at entry ports, as by spin assy, spin membrane immunoassay and the like. No detectors of this specificity are available which do not give false alarms (examples, dogs, gerbils, PN-GC, GC/MS, all respond to smoke and airborne impurities).

I claim:

1. In an ESR spectrometer apparatus having an elongated microwave cavity providing a locus for receiving a sample to be measured for spin resonance response, a microwave energy source for said cavity, and a detector responsive to the microwave energy generated spin resonance signal of the sample in said cavity in sample identifying relation, the improvement comprising, means defining a cavity through passage within said locus, said through passage extending between an inlet and a separate outlet in the wall of said cavity and adapted to transport of said sample through said cavity through passage in microwave energy exposed relation and freely of contact with the walls of said cavity beyond said through passage.

2. Apparatus according to claim 1, in which said cavity through passage inlet and outlet are opposed and lie on a common axis, said common axis being transverse to the cavity longitudinal axis.

3. Apparatus according to claim 1, in which said cavity through passage is adjacent one end of said cavity, and said cavity is open-ended at its other end.

4. In an ESR spectrometer apparatus having an elongated microwave cavity providing a locus for receiving a sample to be measured for spin resonance response, a microwave energy source for said cavity, and a detector responsive to the microwave energy generated spin resonance signal of the sample in said cavity in sample identifying relation, the improvement comprising, means defining a cavity through passage within said locus, said through passage extending between an inlet and a separate outlet in the wall of said cavity, and means to transport said sample through said cavity through passage in microwave energy exposed relation and freely of contact with the walls of said cavity beyond said through passage.

5. Apparatus according to claim 4, in which said sample transporting means comprises a nonspin reasonable signal generating inert carrier dimensioned to traverse said cavity through passage in sample transporting relation.

6. Apparatus according to claim 5, including also means supporting said carrier within said cavity.

7. Apparatus according to claim 6, in which said carrier comprises an elongated tape relative to the length of the cavity through passage, and including also means beyond said cavity to supply and take up said tape in cavity (through) passage traversing relation.

8. Apparatus according to claim 5, in which said sample transporting carrier comprises an elongated tape of indefinite length defining a longitudinally distributed succession of sample locations, said tape being adapted to move progressively through said cavity through passage for longitudinally successive presentation of sample locations for spin resonance response measurement of sample at said locations and coincident with movement of said tape through said passage cavity.

9. In an ESR spectrometer apparatus having an elongated microwave cavity providing a locus for receiving a sample to be measured for spin resonance response, a microwave energy source for said cavity, and a detector responsive to the microwave energy generated spin resonance signal of the sample in said cavity in sample identifying relation, the improvement comprising means defining a cavity passage within said locus, said passage extending between an inlet and an outlet in the wall of said cavity, and means to transport said sample through said cavity passage in microwave energy exposed relation and freely of contact with the walls of said cavity beyond said passage, said transporting means comprising a nonspin resonant signal generating inert elongated tape carrier of indefinite length dimensioned to traverse said cavity passage and defining a longitudinally distributed succession of sample locations including discrete sample means comprising a spin resonant free radical precursor having spin resonant free radical generating response selectively to exposure to ambient fluid containing a predetermined target entity, said tape being adapted to move progressively through said cavity passage for longitudinally successive presentation of sample locations for spin resonance response meaurement of sample at said locations and coincident with movement of said tape through said passage cavity.

10. Apparatus according to claim 9, in which said sample means comprises a spin resonant free radical precursor having spin resonant free radical generating response selectively to exposure to ambient fluid containing a predetermined target entity.

11. Apparatus according to claim 10, in which said tape comprises a succession of microporous beads defining said sample locations, said sample means being embedded in said beads in ambient fluid protected and target entity exposable relation.

12. Apparatus according to claim 11, in which said beads comprise synthetic organic polymer inert to said ambient fluid and preferentially porous to said predetermined target entity.

13. Apparatus according to claim 12, in which said beads comprise polymer of olefins having 2 to 4 carbon atoms or cellulose triacetate.

14. Apparatus according to claim 10, in which said tape comprises an ambient fluid resistant film.

15. Apparatus according to claim 14, in which said sample means is supported on said film in ambient fluid exposable relation.

16. Apparatus according to claim 15, in which said sample means is enclosed in said film in ambient fluid protected and target entity exposable relation.

17. Apparatus according to claim 16, in which said film comprises synthetic organic polymer inert to said ambient medium and preferentially porous to said predetermined target compound.

18. Apparatus according to claim 17, in which said film comprises cellulose triacetate polymer.

19. Apparatus according to claim 17, in which said film comprises polymer of an olefin having from 2 to 4 carbon atoms.

20. Apparatus according to claim 16, including multiple layers of film defining said tape and assembled to enclose in spaced relation a succession of sample means.

21. Apparatus according to claim 10, including also multiple layers of film ambient fluid protectively and target entity exposably enclosing said sample means in discontinuously supported relation on said tape.

22. Apparatus according to claim 10, in which said tape is tubular, said sample means being located periodically within said tubing in ambient fluid protected and target entity exposed relation.

23. Apparatus according to claim 22, in which said tubing comprises gas permeable silicone rubber.

24. Sample transporting carrier adapted for carriage of samples through a microwave cavity passage, said carrier comprising an elongated tape of indefinite length and having discrete sample means at locations thereon comprising a spin resonating free radical precursor at a longitudinally distributed succession of sample locations, said precursor having spin resonant free radical generating response selectively to exposure to ambient fluid containing a predetermined target entity, said tape being adapted to move progressively through said cavity passage for longitudinally successive presentation of sample locations for spin resonance response measurement of sample at said locations and coincident with movement of said tape through said passage cavity.

25. Apparatus according to claim 26, in which said tape comprises a succession of microporous beads defining said sample locations, said sample means being embedded in said beads in ambient fluid protected and target entity exposable relation.

26. Apparatus according to claim 25, in which said beads comprise synthetic organic polymer inert to said ambient fluid and preferentially porous to said predetermined target entity.

27. Apparatus according to claim 26, in which said beads comprise polymer of olefins having 2 to 4 carbon atoms or cellulose triacetate.

28. Apparatus according to claim 27, in which said tape comprises an ambient fluid resistant film.

29. Apparatus according to claim 28, in which said sample means is supported on said film in ambient fluid exposable relation.

30. Apparatus according to claim 29, in which said sample means is enclosed in said film in ambient fluid protected and target entity exposable relation.

31. Apparatus according to claim 30, in which said film comprises synthetic organic polymer inert to said ambient medium and preferentially porous to said predetermined target compound.

32. Apparatus according to claim 31, in which said film comprises cellulose triacetate polymer.

33. Apparatus according to claim 31, in which said film comprises polymer of an olefin having from 2 to 4 carbon atoms.

34. Apparatus according to claim 32, including multiple layers of film defining said tape and assembled to enclose in spaced relation a succession of sample means.

35. Apparatus according to claim 34, including also multiple layers of film ambient fluid protectively and target entity exposably enclosing said sample means in discontinuously supported relation on said tape.

36. Apparatus according to claim 35, in which said tape is tubular, said sample means being located periodically within said tubing in ambient fluid protected and target entity exposed relation.

37. Apparatus according to claim 36, in which said tubing comprises gas permeable silicone rubber.

38. Method of monitoring the presence of trace quantities of a target entity in situ in an ambient fluid, including exposing a selectively target entity-responsive spin resonant free radical precursor to contact with the ambient fluid in supported relation for free radical resonant response to the presence of the target entity in the ambient fluid, subjecting the supported, exposed precursor to microwave energy sufficient to spin resonate precursor-provided free radicals while selectively blocking ambient fluid constituents other than the target entity from contact with said precursor, and sensing the spin resonance as an indication of the presence or absence of the target entity.

39. Method according to claim 38, including also interposing a selectively permeable synthetic organic film between said ambient medium and said precursor in selective fluid constituent blocking relation.

40. Method according to claim 39, including also exposing a series of like supported precursors over time to said ambient fluid in ambient fluid target entity condition change monitoring relation.

41. Method according to claim 39, including also supporting said precursor on a tape adapted to traverse a microwave cavity passage in spin resonating free radical spin resonance measuring relation in timed sequence with precursor exposure to said fluid medium.

* * * * *